United States Patent
Michioka

(10) Patent No.: US 11,296,698 B2
(45) Date of Patent: Apr. 5, 2022

(54) IMPEDANCE CALIBRATION CIRCUIT

(71) Applicant: Winbond Electronics Corp., Taichung (TW)

(72) Inventor: Yoshihisa Michioka, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/234,817

(22) Filed: Apr. 20, 2021

(65) Prior Publication Data

US 2021/0367596 A1    Nov. 25, 2021

(30) Foreign Application Priority Data

May 25, 2020    (JP) .............. JP2020-090267

(51) Int. Cl.
*H03K 19/00*    (2006.01)
*G11C 7/10*    (2006.01)

(52) U.S. Cl.
CPC ....... *H03K 19/0005* (2013.01); *G11C 7/1048* (2013.01)

(58) Field of Classification Search
None
See application file for complete search history.

(56) References Cited

U.S. PATENT DOCUMENTS

| | | | |
|---|---|---|---|
| 7,459,930 B2 | 12/2008 | Mei | |
| 8,004,308 B2 | 8/2011 | Santurkar et al. | |
| 9,531,382 B1 | 12/2016 | Miwa et al. | |
| 2019/0198066 A1* | 6/2019 | Seong | G11C 7/1048 |

FOREIGN PATENT DOCUMENTS

| | | |
|---|---|---|
| JP | H11186896 | 7/1999 |
| JP | 2003345735 | 12/2003 |
| JP | 2008072460 | 3/2008 |
| JP | 2008244729 | 10/2008 |
| JP | 2010171781 | 8/2010 |
| JP | 2011182378 | 9/2011 |

(Continued)

OTHER PUBLICATIONS

"Office Action of Korea Counterpart Application" with English translation thereof, dated May 18, 2021, p. 1 -p. 11.

(Continued)

*Primary Examiner* — Jany Richardson
(74) *Attorney, Agent, or Firm* — JCIPRNET

(57) ABSTRACT

An impedance calibration circuit is provided. The impedance calibration circuit includes a first calibration circuit, a second calibration circuit and a control circuit. The first calibration circuit is adapted to be coupled to an external resistor through a calibration pad, and generate a first voltage according to a first control signal and a resistance value of the external resistor. The second calibration circuit generates a second voltage according to the first control signal and a second control signal. The control circuit is configured to compare the first voltage and a reference voltage to obtain a first comparison result, and compare the first voltage and the second voltage to obtain a second comparison result, and generate the first control signal according to the first comparison result, and generate the second control signal according to the second comparison result.

9 Claims, 3 Drawing Sheets

(56) References Cited

FOREIGN PATENT DOCUMENTS

| | | |
|---|---|---|
| JP | 2012049838 | 3/2012 |
| KR | 20100103146 | 9/2010 |
| KR | 20180023344 | 3/2018 |
| TW | 201101680 | 1/2011 |
| TW | I358203 | 2/2012 |
| TW | I363354 | 5/2012 |
| TW | 201740376 | 11/2017 |

OTHER PUBLICATIONS

"Office Action of Taiwan Counterpart Application", dated Sep. 25, 2020, p. 1-p. 5.
"Office Action of Japan Counterpart Application", dated Mar. 2, 2021, p. 1-p. 4.
"Office Action of Japan Counterpart Application", dated Aug. 3, 2021, p. 1-p. 5.

* cited by examiner

IMPEDANCE CALIBRATION CIRCUIT

CROSS-REFERENCE TO RELATED APPLICATION

This application claims the priority benefit of Japan application serial no. 2020-090267, filed on May 25, 2020. The entirety of the above-mentioned patent application is hereby incorporated by reference herein and made a part of this specification.

BACKGROUND

Field of the Disclosure

The disclosure relates to a memory device, and in particular to an impedance calibration circuit.

Description of Related Art

In the conventional memory technology, when the output impedance of the transmission line between the memory devices and the output impedance of the output circuit of the memory device cannot match each other, the signal transmitted to the output circuit will encounter signal reflection problem, which in turn affect the quality of signal or data transmission between memory devices.

Therefore, a memory device usually performs a ZQ calibration operation to generate a control signal that can optimize the output impedance of the output circuit, so that the output circuit can accurately control the impedance value through the control signal, and make the output impedance of the transmission line between the memory devices to match the output impedance of the output circuit. However, in conventional technology, it is usually required to first calibrate the pull-up circuit in the calibration circuit to obtain the control signal for optimizing the pull-up circuit of the output circuit, only then the pull-down circuit in the calibration circuit can be calibrated, thereby obtaining the control signal for optimizing the pull-down circuit of the output circuit.

In this case, when a conventional memory device performs the ZQ calibration operation, it takes a long time for calibration, which further affects the operation quality of the memory device.

SUMMARY OF THE DISCLOSURE

The disclosure provides an impedance calibration circuit capable of performing calibration operations on the first calibration circuit and the second calibration circuit simultaneously to obtain a control signal for optimizing the output impedance of the output circuit of the memory device, thereby effectively reducing the processing time of the impedance calibration circuit.

An impedance calibration circuit of the disclosure includes a first calibration circuit, a second calibration circuit and a control circuit. The first calibration circuit is adapted to be coupled to an external resistor through a calibration pad, and generate a first voltage according to a first control signal and a resistance value of the external resistor. The second calibration circuit generates a second voltage according to the first control signal and a second control signal. The control circuit is configured to compare the first voltage with a reference voltage to obtain a first comparison result, and compare the first voltage with the second voltage to obtain a second comparison result, and generate the first control signal according to the first comparison result, and generate the second control signal according to the second comparison result.

Based on the above, the impedance calibration circuit described in the embodiments of the disclosure can utilize the first calibration circuit to calibrate the resistance value of the first transistor according to the first control signal, so that the resistance value of the first transistor is the same as the resistance value of the external resistor, and simultaneously utilize the second calibration circuit to calibrate the resistance values of the second and the third transistors according to the first and the second control signals, so that the resistance values of the second and the third transistors can also be the same as the resistance value of the external resistor. In this manner, the impedance calibration circuit can simultaneously provide the first and the second control signals corresponding to the resistance values of the first to the third transistors that are substantially the same as the resistance value of the external resistor to the output circuit of the memory device, thereby optimizing the output impedance of the output circuit, and the processing time of the impedance calibration circuit can be effectively reduced.

DESCRIPTION OF EMBODIMENTS

Figure 1:
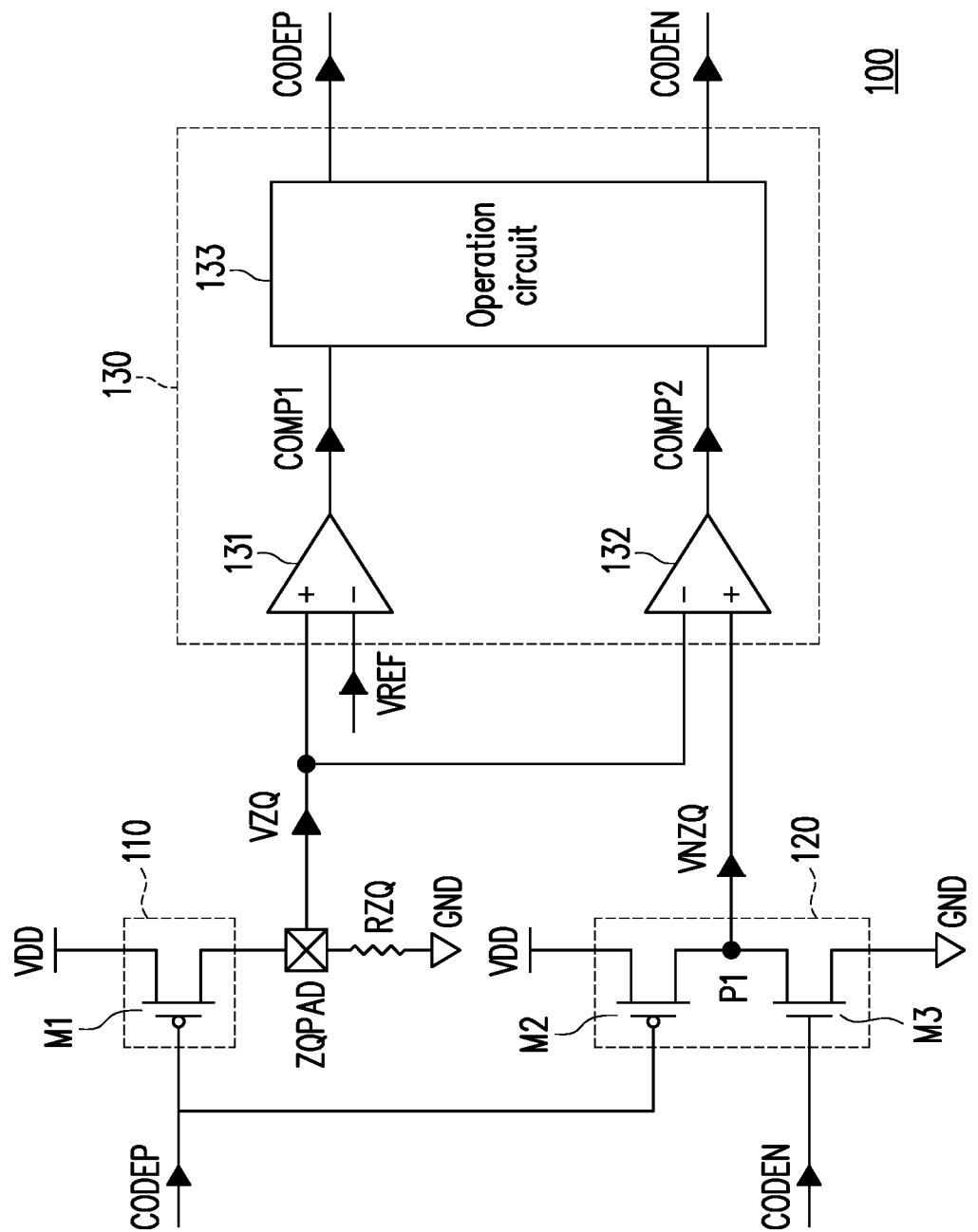
FIG. 1 is a schematic circuit diagram of an impedance calibration circuit according to an embodiment of the disclosure.

FIG. 1 is a schematic circuit diagram of an impedance calibration circuit 100 according to an embodiment of the disclosure. Referring to FIG. 1, the impedance calibration circuit 100 includes calibration circuits 110 and 120 and a control circuit 130. In this embodiment, the impedance calibration circuit 100 may be provided in the memory device, and the control signals CODP and CODEN generated by the impedance calibration circuit 100 may be provided to the output circuit of the memory device to optimize the output impedance of the output circuit. In this manner, the output impedance of the output circuit can be adjusted to the optimal value by the optimized control signals CODP and CODEN.

In the embodiment, the calibration circuit 110 includes a transistor M1. The first terminal of the transistor M1 is coupled to the operating voltage VDD, and the second terminal of the transistor M1 is coupled to the external resistor RZQ through the calibration pad ZQPAD. The calibration circuit 110 can generate the voltage VZQ according to the control signal CODEP and the resistance value of the external resistor RZQ.

In the embodiment, the calibration circuit 120 includes a transistor M2 and a transistor M3. The first terminal of the transistor M2 is coupled to the operating voltage VDD, and the control terminal of the transistor M2 receives the control signal CODEP. The first terminal of the transistor M3 is coupled to the ground voltage GND, the second terminal of the transistor M3 is coupled to the second terminal of the transistor M2, and the control terminal of the transistor M3 receives the control signal CODEN. Specifically, the calibration circuit 120 can generate the voltage VNZQ according to the control signal CODEP and the control signal CODEN.

Note that, the calibration circuit 110 and the calibration circuit 120 of this embodiment may substantially have the same configuration as the output circuit of the memory device, and the calibration circuit 110 and the calibration circuit 120 may have the voltage-to-current property equivalent to the output circuit of the memory device. Specifically, the transistor M1 and the transistor M2 of this embodiment may be implemented by P-type transistors, and the transistor M3 may be implemented by N-type transistors, but the disclosure is not limited thereto. In addition, the external resistor RZQ of this embodiment may have a resistance value that satisfies the requirements of the output circuit of the memory device.

On the other hand, the control circuit 130 is coupled to the calibration pad ZQPAD and the calibration circuit 120. In this embodiment, the control circuit 130 includes comparators 131, 132 and an operation circuit 133. The first input terminal (i.e., non-inverting input terminal) of the comparator 131 is coupled to the calibration pad ZQPAD to receive the voltage VZQ, and the second input terminal (i.e., inverting input terminal) of the comparator 131 receives the reference voltage VREF. In addition, the comparator 131 can generate the comparison result COMP1 at its output terminal by comparing the voltage VZQ with the reference voltage VREF. In the meantime, the voltage value of the reference voltage VREF in this embodiment may be set as a half of the voltage value of the operating voltage VDD, but the disclosure is not limited thereto.

The first input terminal (i.e., non-inverting input terminal) of the comparator 132 is coupled to the calibration circuit 120 to receive the voltage VNZQ, and the second input terminal (i.e., inverting input terminal) of the comparator 132 is coupled to the calibration pad ZQPAD to receive the voltage VZQ. In addition, the comparator 132 can generate a comparison result COMP2 at its output terminal by comparing the voltage VZQ with the voltage VNZQ.

On the other hand, the operation circuit 133 is coupled to the output terminal of the comparator 131 and the output terminal of the comparator 132 to receive the comparison result COMP1 and the comparison result COMP2 respectively. Moreover, the operation circuit 133 can generate the control signal CODEP according to the comparison result COMP1 and generate the control signal CODEN according to the comparison result COMP2.

With regard to the details of the operation of the impedance calibration circuit 100, specifically, the impedance calibration circuit 100 of the embodiment has a calibration pad ZQPAD for performing a ZQ calibration operation. Since the calibration pad ZQPAD can be coupled to the ground voltage GND through an external resistor RZQ, and the transistor M1 of the calibration circuit 110 is disposed between the operating voltage VDD and the calibration pad ZQPAD, the calibration circuit 110 can adjust the voltage value of the voltage VZQ on the calibration pad ZQPAD to be a half of the voltage value of the operating voltage VDD based on the control signal CODEP, so that the resistance value of the transistor M1 can be substantially equal (or approximate) to the resistance value of the external resistor RZQ.

Further, when the comparator 131 compares the voltage VZQ with the reference voltage VREF and generates the comparison result COMP1 indicating that the voltage value of the voltage VZQ is not equal to the voltage value of the reference voltage VREF (i.e., half of the voltage value of the operating voltage VDD), it means that the resistance value of the transistor M1 is not yet equal (or approximate) to the resistance value of the external resistor RZQ. Under the circumstances, the operation circuit 133 will perform a binary search according to the comparison result COMP1 to further calculate the control signal CODEP that can make the voltage value of the voltage VZQ on the calibration pad ZQPAD to be equal (or approximate) to half of the voltage value of the operating voltage VDD.

In detail, assuming that the control signal CODEP in this embodiment is expressed in a binary form in 7 bits, when the comparator 131 generates the comparison result COMP1 indicating that the voltage value of the voltage VZQ is not equal to the voltage value of the reference voltage VREF, the operation circuit 133 can adjust the bits of the control signal CODEP bit by bit according to the voltage value of the current comparison result COMP1.

For example, when the impedance calibration circuit 100 determines that the voltage difference between the voltage VZQ and the reference voltage VREF is large according to the comparison result COMP1, the operation circuit 133 may adjust the most significant bit (MSB) of the control signal CODEP, and provides the adjusted control signal CODEP to the calibration circuit 110. Then, the calibration circuit 110 can increase or decrease the voltage value of the voltage VZQ with a relatively large adjustment range according to the adjusted control signal CODEP, so that the voltage value of the voltage VZQ can be approximate to the voltage value of the reference voltage VREF.

In contrast, when the impedance calibration circuit 100 determines that the voltage difference between the voltage VZQ and the reference voltage VREF is small according to the comparison result COMP1, the operation circuit 133 may adjust the least significant bit (LSB) of the control signal CODEP, and provides the adjusted control signal CODEP to the calibration circuit 110. Next, the calibration circuit 110 can increase or decrease the voltage value of the voltage VZQ with a relatively small adjustment range according to the adjusted control signal CODEP, so that the voltage value of the voltage VZQ can be substantially equal (or approximate) to the voltage value of the reference voltage VREF.

In other words, in the case where the voltage value of the voltage VZQ has not been substantially equal (or approximate) to the voltage value of the reference voltage VREF, the operation circuit 133 of this embodiment can adjust the control signal CODEP from high bit to low bit in sequence according to the comparison result COMP1 depending on the voltage difference between the voltage VZQ and the reference voltage VREF. As such, the calibration circuit 110 can fine-tune the voltage VZQ on the calibration pad ZQPAD according to the adjusted control signal CODEP until the calibration circuit 110 can adjust the voltage value of the voltage VZQ to be substantially equal (or approximate) to the voltage value of the reference voltage VREF (that is, to adjust the resistance value of the transistor M1 to be substantially equal (or approximate) to the resistance value of the external resistor RZQ) according to the adjusted control signal CODEP.

It should be noted that when the voltage value of the voltage VZQ is steadily close to the voltage value of the reference voltage VREF, the operation circuit 133 will make the control signal CODEP in this state be fixed, and provide the control signal CODEP corresponding to this state to the transistor M1 of the calibration circuit 110 and the transistor M2 of the calibration circuit 120, thereby making the resistance values of the transistor M1 and the transistor M2 be fixed, so that the resistance values of the transistor M1 and the transistor M2 are fixed at the resistance value of the external resistor RZQ.

On the other hand, in the calibration circuit 120, since the transistor M2 and the transistor M3 are coupled in series between the operating voltage VDD and the ground voltage GND, the calibration circuit 120 can adjust the voltage value of the voltage VNZQ on the node P1 to be half of the voltage value of the operating voltage VDD based on the control signal CODEP and the control signal CODEN, such that the resistance value of the transistor M3 may be substantially equal (or approximate) to the resistance value of the transistor M2.

In detail, when the operation circuit 133 makes the state of the control signal CODEP to be fixed so that the transistor M1 and the transistor M2 can be simultaneously adjusted to be the same as the resistance value of the external resistor RZQ according to the control signal CODEP, the comparator 132 will further generate the comparison result COMP2 by comparing the voltage VZQ on the calibration pad ZQPAD with the voltage VNZQ on the node P1.

Further, when the comparator 132 generates the comparison result COMP2 indicating that the voltage value of the voltage VNZQ is not equal to the voltage value of the voltage VZQ (that is, half of the voltage value of the operating voltage VDD) by comparing the voltage VZQ with the voltage VNZQ, it means that the resistance value of the transistor M3 has not been equal (or approximate) to the resistance value of the transistor M2. Under the circumstances, the operation circuit 133 performs a binary search according to the comparison result COMP2 to further calculate the control signal CODEN capable of making the voltage value of the voltage VNZQ to be equal (or approximate) to the voltage value of the voltage VZQ.

Specifically, assuming that the control signal CODEN in this embodiment is expressed in a binary form in 7 bits, when the comparator 132 generates the comparison result COMP2 indicating that the voltage value of the voltage VNZQ is not equal to the voltage value of the voltage VZQ, the operation circuit 133 can adjust the bits of the control signal CODEN bit by bit according to the voltage value of the current comparison result COMP2.

For example, when the impedance calibration circuit 100 determines that the voltage difference between the voltage VNZQ and the voltage VZQ is large according to the comparison result COMP2, the operation circuit 133 may adjust the most significant bit of the control signal CODEN, and provide the adjusted control signal CODEN to the transistor M3 of the calibration circuit 120. Then, the transistor M3 can increase or decrease the voltage value of the voltage VNZQ with a relatively large adjustment range according to the adjusted control signal CODEN, so that the voltage value of the voltage VNZQ can be approximate to the voltage value of the voltage VZQ.

On the contrary, when the impedance calibration circuit 100 determines that the voltage difference between the voltage VNZQ and the voltage VZQ is small according to the comparison result COMP2, the operation circuit 133 may adjust the least significant bit of the control signal CODEN, and provide the adjusted control signal CODEN to the transistor M3 of the calibration circuit 120. Then, the transistor M3 can increase or decrease the voltage value of the voltage VNZQ with a relatively small adjustment range according to the adjusted control signal CODEN, so that the voltage value of the voltage VNZQ can be substantially equal (or approximate) to the voltage value of the voltage VZQ.

In other words, in the case where the voltage value of the voltage VNZQ has not been substantially equal (or approximate) to the voltage value of the voltage VZQ, the operation circuit 133 of this embodiment can adjust the control signal CODEN from high bit to low bit in sequence according to the comparison result COMP2 depending on the voltage difference between the voltage VNZQ and the voltage VZQ. As such, the calibration circuit 120 can fine-tune the voltage VNZQ on the node P1 according to the adjusted control signal CODEP and the control signal CODEN until the calibration circuit 120 can adjust the voltage value of the voltage VNZQ to be substantially equal (or approximate) to the voltage value of the voltage VZQ (that is, to adjust the resistance value of the transistor M3 to be substantially equal (or approximate) to the resistance value of the transistor M2) according to the adjusted control signal CODEP and the control signal CODEN.

It should be noted that when the voltage value of the voltage VNZQ is steadily close to the voltage value of the voltage VZQ, the operation circuit 133 will make the control signal CODEN in this state be fixed, and provide the control signal CODEN corresponding to this state to the transistor M3 of the calibration circuit 120, thereby making the resistance value of the transistor M3 be fixed, so that the resistance value of the transistor M3 is fixed at the resistance value of the external resistor RZQ.

Figure 2:
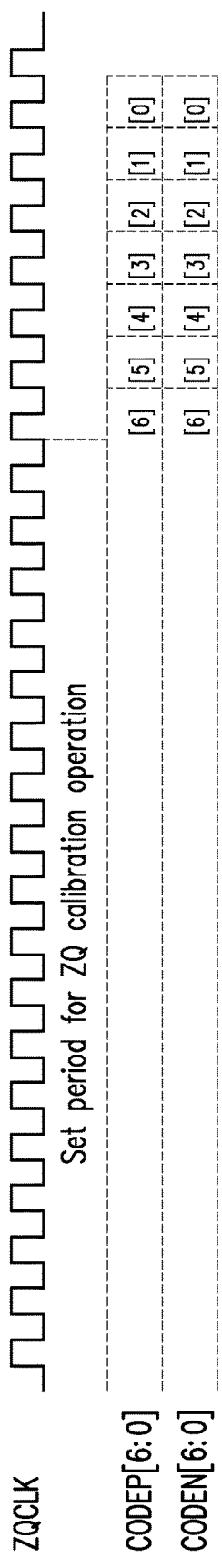
FIG. 2 is a timing diagram of control signals according to an embodiment of the disclosure.

In this regard, please refer to FIG. 1 and FIG. 2 together. FIG. 2 is a timing diagram of control signals CODEP and CODEN according to an embodiment of the disclosure. In this embodiment, the impedance calibration circuit 100 can generate the clock signal ZQCLK through an external clock generator or an oscillator (not shown). Moreover, the impedance calibration circuit 100 may perform the ZQ calibration operation according to the timing state of the clock signal ZQCLK.

Specifically, the impedance calibration circuit 100 may start performing the ZQ calibration operation after the memory device completes a set period for the ZQ calibration operation. In the embodiments of FIG. 1 and FIG. 2, the first input terminal (i.e., non-inverting input terminal) of the comparator 131 and the second input terminal (i.e., inverting input terminal) of the comparator 132 receive the voltage VZQ on the calibration pad ZQPAD together. Therefore, under some design requirements (in some embodiments), the comparator 131 and the comparator 132 can simultaneously generate the comparison result COMP1 and the comparison result COMP2, so that the operation circuit 133 can simultaneously adjust the bits of the control signals CODEP and CODEN through the binary search according to the voltage values of the comparison results COMP1 and COMP2.

Under the circumstances, the impedance calibration circuit 100 of the embodiment can perform the calibration operation on the transistor M1 of the calibration circuit 110 and the transistors M2 and M3 of the calibration circuit 120 simultaneously, such that the resistance values of the transistors M1 to M3 can be substantially equal (or approximate) to the resistance value of the external resistor RZQ according to the adjusted control signals CODEN and CODEP, thereby effectively reducing the processing time of the impedance calibration circuit 100. In the meantime, the impedance calibration circuit 100 can provide the control signals CODEN and CODEP, that are capable of making the resistance values of the transistors M1 to M3 to be substantially equal (or approximate) to the resistance value of the external resistor RZQ, to the output circuit of the memory device to optimize the output impedance of the output circuit.

Figure 3:
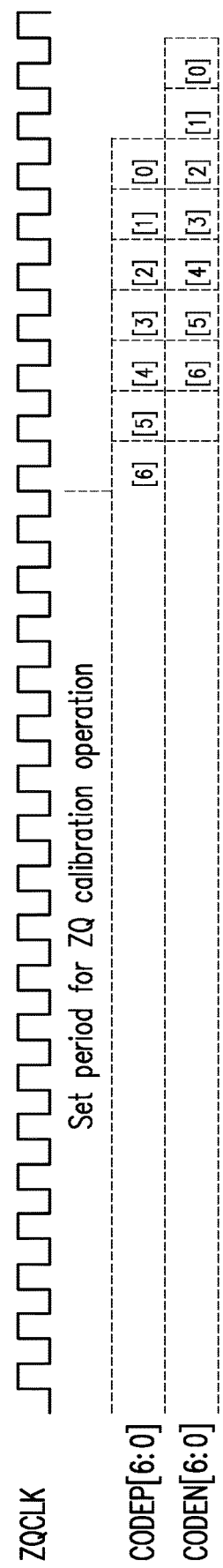
FIG. 3 is a timing diagram of control signals according to another embodiment of the disclosure.

FIG. 3 is a timing diagram of control signals CODEP and CODEN according to another embodiment of the disclosure. Please refer to FIG. 1 and FIG. 3 together. In this embodiment, the calibration circuit 120 needs to adjust the voltage VNZQ to the voltage value of the voltage VZQ according to the adjusted control signal CODEN so as to make the resistance value of the transistor M3 to be substantially the same as the resistance value of the transistor M2; therefore, when the voltage value of the voltage VZQ is changed, the voltage value of the voltage VNZQ is bound to be adjusted to some extent.

In this case, in the calibration circuit 120, the voltage difference between the second terminal (i.e., the drain terminal) and the first terminal (i.e., the source terminal) of the transistor M3 may be affected by the change of the voltage value of the voltage VNZQ, and which will cause the set value of the voltage difference to be incorrect, consequently the transistor M3 cannot operate in the linear region.

Therefore, under other design requirements (in other embodiments), the operation circuit 133 of this embodiment may delay to generate the control signal CODEN (for example, to generate the control signal CODEN successively after the most significant bit and the 6$^{th}$ bit of the control signal CODEN are output, but the disclosure is not limited thereto) and calibrate the resistance values of the transistors M1 and M2 first, and then perform the ZQ calibration operation by calibrating the resistance value of the transistor M3.

Similarly, the impedance calibration circuit 100 can also provide the control signals CODEN and CODEP, that are capable of making the resistance values of the transistors M1 to M3 to be substantially equal (or approximate) to the resistance value of the external resistor RZQ, to the output circuit of the memory device to optimize the output impedance of the output circuit.

Figure 4:
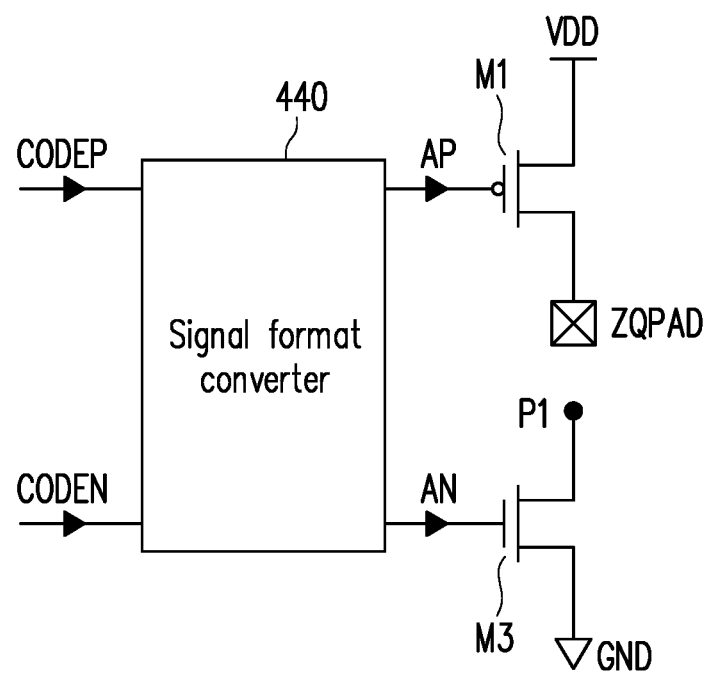
FIG. 4 is a partial circuit diagram illustrating the impedance calibration circuit shown in FIG. 1 according to another embodiment of the disclosure.

FIG. 4 is a partial circuit diagram illustrating the impedance calibration circuit 100 shown in FIG. 1 according to another embodiment of the disclosure. Please refer to FIG. 1 and FIG. 4. The impedance calibration circuit 100 shown in FIG. 1 may further include a signal format converter 440. The signal format converter 440 in this embodiment may be a digital to analog converter (DAC).

In this embodiment, the signal format converter 440 may be coupled to the operation circuit 133 to receive the control signals CODEP and CODEN. Different from the embodiment of FIG. 1, in this embodiment, after the operation circuit 133 performs the binary search, the signal format converter 440 can convert the control signal CODEP with a digital form into the control signal AP with an analog form, and generate the control signal AP to the transistor M1 of the calibration circuit 110 and the transistor M2 of the calibration circuit 120. In contrast, the signal format converter 440 may convert the control signal CODEN with a digital form into the control signal AN with an analog form, and generate the control signal AN to the transistor M3 of the calibration circuit 120.

Therefore, in this embodiment, the calibration circuit 110 can adjust the voltage value of the voltage VZQ according to the control signal AP and the resistance value of the external resistor RZQ, and the calibration circuit 120 can adjust the voltage value of the voltage VNZQ according to the control signals AP and AN.

For details of the operation that the operation circuit 133 adjusts the bits of the control signals CODEP and CODEN through the binary search, reference may be made to the relevant description in the embodiment of FIG. 1, so no further description is incorporated herein.

In summary, the impedance calibration circuit of the disclosure can utilize the first calibration circuit to calibrate the resistance value of the first transistor according to the first control signal, so that the resistance value of the first transistor is the same as that of the external resistor, and simultaneously utilize the second calibration circuit to calibrate the resistance values of the second and the third transistors according to the first and the second control signals, so that the resistance values of the second and the third transistors can also be the same as those of the external resistors. In this way, the impedance calibration circuit can provide the first and the second control signals, that are capable of making the resistance values of the first to the third transistors to be substantially equal to the resistance value of the external resistor, to the output circuit of the memory device to optimize the output impedance of the output circuit, so that the processing time of the impedance calibration circuit can be effectively reduced.

What is claimed is:

1. An impedance calibration circuit, comprising:
   a first calibration circuit adapted to be coupled to an external resistor through a calibration pad, and generate a first voltage according to a first control signal and a resistance value of the external resistor;
   a second calibration circuit generating a second voltage according to the first control signal and a second control signal;
   a control circuit configured to compare the first voltage with a reference voltage to obtain a first comparison result, and compare the first voltage with the second voltage to obtain a second comparison result, and generate the first control signal according to the first comparison result, and generate the second control signal according to the second comparison result; and
   a signal format converter coupled to the control circuit and configured to convert a format of the first control signal and a format of the second control signal.

2. The impedance calibration circuit according to claim 1, wherein the first calibration circuit comprises:
   a first transistor having a first terminal coupled to an operating voltage, a second terminal thereof coupled to the calibration pad, a control terminal thereof receiving the first control signal, and configured to adjust a resistance value of the first transistor according to the first control signal.

3. The impedance calibration circuit according to claim 2, wherein the second calibration circuit comprises:
   a second transistor having a first terminal coupled to the operating voltage, and a control terminal thereof receiving the first control signal, and configured to adjust a resistance value of the second transistor according to the first control signal; and
   a third transistor having a first terminal coupled to a ground voltage, a second terminal thereof coupled to a second terminal of the second transistor, and a control terminal thereof receiving the second control signal, and configured to adjust a resistance value of the third transistor according to the second control signal.

4. The impedance calibration circuit according to claim 3, wherein the first transistor and the second transistor are P-type transistors, and the third transistor is an N-type transistor.

5. The impedance calibration circuit according to claim 1, wherein a voltage value of the reference voltage is half of a voltage value of an operating voltage.

6. The impedance calibration circuit according to claim 1, wherein the control circuit comprises:
- a first comparator having a first input terminal receiving the first voltage, and a second input terminal thereof receiving the reference voltage, so as to generate the first comparison result at an output terminal of the first comparator;
- a second comparator having a first input terminal receiving the second voltage, and a second input terminal thereof receiving the first voltage, so as to generate the second comparison result at an output terminal of the second comparator;
- an operation circuit receiving the first comparison result and the second comparison result, and generating the first control signal according to the first comparison result, and generating the second control signal according to the second comparison result.

7. The impedance calibration circuit according to claim 6, wherein the operation circuit is configured to perform a binary search to generate the first control signal according to the first comparison result, and generate the second control signal according to the second comparison result.

8. The impedance calibration circuit according to claim 7, wherein the operation circuit adjusts bits of the first control signal bit by bit in sequence according to a voltage value of the first comparison result, and adjusts bits of the second control signal bit by bit in sequence according to a voltage value of the second comparison result.

9. The impedance calibration circuit according to claim 1, wherein the signal format converter is a digital-to-analog converter.

* * * * *